United States Patent [19]
Nishibayashi et al.

[11] Patent Number: 5,382,809
[45] Date of Patent: Jan. 17, 1995

[54] SEMICONDUCTOR DEVICE INCLUDING SEMICONDUCTOR DIAMOND

[75] Inventors: Yoshiki Nishibayashi; Tadashi Tomikawa; Shinichi Shikata, all of Hyogo, Japan

[73] Assignee: Sumitomo Electric Industries, Ltd., Osaka, Japan

[21] Appl. No.: 118,940

[22] Filed: Sep. 9, 1993

[30] Foreign Application Priority Data

Sep. 14, 1992 [JP] Japan .................. 4-244723
Aug. 30, 1993 [JP] Japan .................. 5-214192
Aug. 31, 1993 [JP] Japan .................. 5-216286

[51] Int. Cl.⁶ ............... H01L 29/78; H01L 29/16; H01L 29/167
[52] U.S. Cl. ...................... 257/77; 257/410; 257/607
[58] Field of Search ............... 257/77, 256, 410, 607

[56] References Cited

U.S. PATENT DOCUMENTS

| | | | |
|---|---|---|---|
| 5,107,315 | 4/1992 | Kumagi et al. | 257/410 |
| 5,173,761 | 12/1992 | Dreifus et al. | 257/77 |
| 5,254,862 | 10/1993 | Kalyankjumar et al. | 257/77 |
| 5,298,765 | 3/1994 | Nishimura | 257/77 |

FOREIGN PATENT DOCUMENTS

| | | | |
|---|---|---|---|
| 1-143323 | 6/1989 | Japan . | |
| 1158774 | 6/1989 | Japan | 257/77 |
| 2252202 | 7/1992 | United Kingdom | 257/77 |

*Primary Examiner*—Gene M. Munson
*Attorney, Agent, or Firm*—W. G. Fasse; W. F. Fasse

[57] ABSTRACT

A semiconductor device having an MISFET-like structure. The semiconductor device comprises: an p-type semiconductor diamond layer disposed on an insulating diamond substrate for providing a channel region; and a drain electrode, a source electrode and a gate electrode disposed on the p-type diamond layer. An intermediate region comprising diamond doped with at least an n-type dopant such as nitrogen atoms, is formed between the channel region and the gate electrode.

21 Claims, 7 Drawing Sheets

SEMICONDUCTOR DEVICE INCLUDING SEMICONDUCTOR DIAMOND

BACKGROUND OF THE INVENTION

1. Field of the Invention

The present invention relates to a semiconductor device comprising semiconductor diamond, more specifically to a semiconductor device wherein that an electric field to be applied to a channel formed in the interior of the device located between a drain electrode and a source electrode, is modulated or changed by applying a voltage to a gate electrode, thereby controlling a current flowing through the channel.

2. Related Background Art

Diamond is noted as a material applicable to a semiconductor device which is stably operative even under severe circumstances, e.g., at high temperature, under radiation, etc., or is durably operative even at high output.

A reason that diamond is operative at high temperature is its band gap which is as large as 5.5 eV. In other words, an intrinsic range, i.e., a temperature range where carriers of diamond semiconductor cannot be controlled is absent below 1400° C.

However, when a semiconductor device is intended to be fabricated by using diamond as a material therefor, it has not necessarily been easy to form a self-aligned type semiconductor device by use of an ion implantation technique.

On the other hand, stable operation of a diamond semiconductor device at high temperature has hitherto been realized by an FET (field-effect transistor) including a non-doped layer of diamond disposed under the gate electrode thereof (as described in Japanese Patent Application No. 301684/1987, i.e., Japanese Laid-Open Patent Application No. 143323/1989).

However, the following points should have been considered at the time of the formation of a non-doped diamond layer on a boron-doped diamond layer (active layer).

When the reaction for forming the non-doped diamond layer is conducted in the same reaction chamber as the reaction for forming the boron-doped diamond layer, it is not easy to form a sharp or steep non-doped layer (i.e., a layer having a composition clearly distinct from that of the active layer) on the active layer (i.e., a boron-doped layer). As a result, the non-doped layer disposed under the gate electrode tends to be thicker, and therefore it is not easy to obtain good transistor characteristics.

On the other hand, when a different reaction chamber is employed in order to form a sharp non-doped layer, a trap level tends to be provided between the boron-doped layer and the non-doped layer.

It is preferred that the above-mentioned non-doped layer has a high purity, and is thin and uniform. However, in general, since diamond is not grown in a step-wise manner, the resultant deposited film tends to have an island-like shape. Accordingly, it is not necessarily easy to form a thin and uniform (or homogeneous) non-doped diamond film. When such an island-like deposited layer of non-doped diamond is disposed between the boron-doped layer and a gate electrode, the leakage current from the gate electrode tends to be increased.

SUMMARY OF THE INVENTION

An object of the present invention is to provide a semiconductor device that has a structure similar to that of a MISFET (a metal insulator semiconductor field-effect transistor), and has an improved layer corresponding to the above-mentioned diamond non-doped layer to be disposed between an active layer and a gate electrode.

As a result of earnest study, the present inventors have found that it is very effective in achieving the above-mentioned object to form a region (hereinafter, referred to as "intermediate region") comprising diamond doped with at least an n-type or p-type dopant (in place of a simple non-doped diamond layer) between a gate electrode and an active layer comprising p-type diamond as a main component.

The present invention is based on the above discovery. More specifically, according to the present invention, there is provided a semiconductor device, comprising: a source electrode and a drain electrode disposed on a substrate; a channel region located between the source and drain electrodes, which comprises p-type diamond as a main component; a gate electrode disposed on the channel region; and an intermediate region formed between the channel region and the gate electrode, which comprises diamond doped with at least an n-type or p-type dopant in a predetermined amount.

The present invention also provides a semiconductor device, comprising: a source electrode and a drain electrode disposed on a substrate; a channel region located between the source and drain electrodes, which comprises p-type diamond as a main component; a gate electrode disposed on the channel region; and an intermediate region formed between the channel region and the gate electrode, which comprises diamond doped with at least an n-type dopant.

The present invention further provides a semiconductor device, comprising: a source electrode and a drain electrode disposed on a substrate; a channel region located between the source and drain electrodes, which comprises p-type diamond as a main component; a gate electrode disposed on the channel region; and an insulating layer and a layer containing an n-type dopant which are formed between the channel region and the gate electrode in this order from the gate electrode side.

The present invention further provides a semiconductor device, comprising: a source electrode and a drain electrode disposed on a substrate; a channel region located between the source and drain electrodes, which comprises p-type diamond as a main component; a gate electrode disposed on the channel region; and an insulating region which is formed between the channel region and the gate electrode, and is formed by ion implantation into p-type diamond.

In the semiconductor device according to the present invention, an electric field to be applied to a channel which is formed in the interior of the device and located between the drain electrode and the source electrode of the device, is modulated or changed by applying a voltage to the gate electrode, so that a current flowing through the channel may be controlled.

In the semiconductor device according to the present invention, the layer (active layer) wherein the channel is to be formed comprises p-type diamond as a main component, and the intermediate region formed between the active layer and the gate electrode comprises diamond doped with at least an n-type or p-type dopant.

The above intermediate region may also be provided by transforming at least a part of the p-type diamond constituting the active layer into an intrinsic region, i.e., by imparting an intrinsic nature to at least a part of the p-type diamond. Such an intrinsic region may be formed by compensating the p-type dopant contained in the p-type diamond with an n-type dopant (such as nitrogen and phosphorus), or by introducing a Group IV element (such as carbon and silicon) into the p-type diamond.

Since the intermediate region according to the present invention comprises diamond doped with at least an n-type or p-type dopant, the degree of freedom or latitude in the formation of the intermediate region may be increased, as compared with that in the formation of the conventional interposing layer simply consisting of a non-doped diamond layer. In other words, in the present invention, it is possible to suitably select the process for forming the intermediate region, in accordance with a desired structure and/or characteristic of a semiconductor device to be obtained. Accordingly, a thin and uniform intermediate region suitable for achieving a good transistor characteristic may easily be formed, e.g., by ion implantation, etc.

According to the present invention, in an embodiment where the above intermediate region comprises diamond doped with an n-type dopant (such as nitrogen), when the concentration of the n-type dopant is not less than $10^{15}$ cm$^{-3}$ and less than $10^{19}$ cm$^{-3}$, the intermediate region is insulative at room temperature, but is an n-type semiconductor at a high temperature (e.g., 500° C. or higher). Accordingly, a semiconductor device including such an intermediate region may function as a MISFET at room temperature, and may function as a JFET (junction field-effect transistor) at a high temperature. In other words, a good characteristic may be provided both at room temperature and at high temperature. On the other hand, when the concentration of the n-type dopant is $10^{19}$ cm$^{-3}$ or more or when the above diamond is doped with an n-type dopant and a p-type dopant so as to satisfy a predetermined relationship described hereinafter, the intermediate region comprises an n-type semiconductor, and therefore a semiconductor device including such an intermediate region may function as a JFET.

In addition, in an embodiment of the present invention where the intermediate region comprises diamond doped with an n-type dopant, the junction between the intermediate region and another layer may be made sharp or steep, so that the thickness of the intermediate region may be decreased. As a result, the driving voltage for a device including such an intermediate region may be lowered.

In an embodiment of the present invention where the intermediate region is formed by ion implantation, the resultant intermediate region may be provided as a thin and uniform region. Accordingly, in a device including such an intermediate region, leakage current from the gate electrode can be suppressed so as to provide a good transistor characteristic.

Furthermore, in the semiconductor device according to the present invention, it is possible to form the intermediate region i.e., the region doped with at least an n-type or p-type dopant, between the gate electrode and active layer so that the resultant device including the intermediate region may be adapted to high-temperature or high-output operation, by use of an appropriate technique such as ion implantation. Accordingly, the semiconductor device according to such an embodiment may provide a good source-drain characteristic (transistor characteristic) as an FET, even under severe conditions as described above.

In fabricating the semiconductor device according to the present invention, for example, a method can be used wherein a drain electrode and a source electrode are formed on a layer comprising p-type diamond as a main component, and then an intermediate region of diamond doped with an n-dopant or a Group IV element is formed by subjecting a predetermined part of the p-type diamond layer to appropriate processing such as ion implantation, while the source and drain electrodes are utilized as a mask. Accordingly, the intermediate region may be provided in a self-aligned form. In other words, it is easy to form the intermediate region exactly in alignment with or corresponding to the positions of the drain and source electrodes.

The present invention will become more fully understood from the following detailed description and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

Preferred embodiments of the present invention will now be described in detail with reference to the accompanying drawings.

Figure 1:
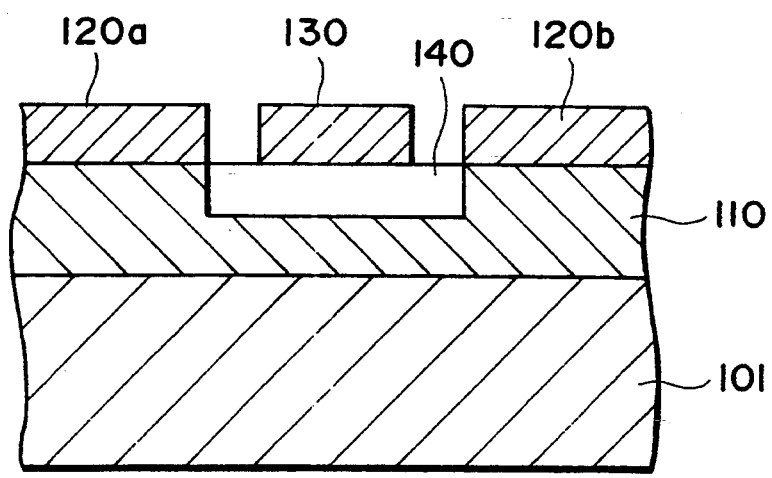
FIG. 1 is a schematic sectional view showing an embodiment of the semiconductor device according to the present invention.

FIG. 1 is a schematic sectional view showing a transistor (FET) as an embodiment of the semiconductor device according to the present invention. FIG. 1 shows an example of n-channel FET.

Referring to FIG. 1, the above FET comprises, on a substrate 101 of insulating diamond, a p-type semiconductor diamond layer 110; and a drain electrode 120a, a source electrode 120b, and a gate electrode 130 which are disposed on the p-type semiconductor diamond layer 110. Further, the FET has a structure including an intermediate region 140 which is formed under the gate electrode 130, and comprises diamond doped with a p-type dopant and an n-type dopant (or a Group IV element).

The drain electrode 120a and the source electrode 120b are in ohmic contact with the p-type diamond layer 110. The material constituting the drain electrode 120a and the source electrode 120b may preferably comprise a metal having a melting point of 900° C. or higher (such as W, Mo, Ta and Ti), so as to facilitate the formation of a self-aligned type device.

It is preferred that the p-type diamond layer 110 is formed as a layer doped with a p-type dopant such as boron on the insulating diamond substrate 101, e.g., by a thin film forming technique such as epitaxial growth.

The intermediate region 140 doped with a p-type dopant and an n-type dopant may preferably be formed, e.g., by introducing an n-type dopant (such as nitrogen, phosphorus, sulfur and arsenic) into the p-type diamond layer 110 so as to compensate an impurity (p-type dopant) contained in a predetermined part of the diamond layer 110; or by introducing a Group IV element (such as carbon ion and silicon ion) so as to convert a predetermined part of the p-type diamond layer 110 into an intrinsic region, in view of easy formation of a thin and uniform or homogeneous intermediate region 140.

Such an n-type dopant and/or a Group IV element may preferably be introduced into the p-type diamond layer 110 by ion implantation or plasma irradiation so as to facilitate the fabrication of a self-aligned type device. In view of recovery or restoration of carriers, or recovery of defects due to the ion implantation, etc., it is preferred to conduct annealing such as plasma annealing and thermal annealing.

In the FET of FIG. 1, diamond is used as a material for the semiconductor. Diamond has a wide band gap of 5.5 eV, and a temperature range therefor corresponding to the intrinsic region is absent below 1400° C., at which diamond is thermally stable. In addition, diamond is chemically very stable. Further, diamond has other advantages characteristics including a thermal conductivity of 20 W/cm·K, which is 10 times or more that of Si, good thermal radiation, large carrier mobility (electron mobility: 2000 cm$^2$/V·sec, hole mobility: 2100 cm$^2$/V·sec at 300K), small dielectric constant (K=5.5), high breakdown electric field (E=5×10$^6$ V/cm), etc. Accordingly, in the present invention, the use of diamond as a semiconductor material makes it possible to easily fabricate a device which has a good frequency characteristic, can stably be operated at high temperature, and is suitable for operation under high frequency and/or high power.

In the FET of FIG. 1, in a case where an insulating intermediate region 140 under the gate electrode 130 is formed by introducing an impurity (n-type dopant or a Group IV element) into the p-type diamond layer 110, the intermediate region 140 can be thinner and more uniform as compared with a layer formed by a thin-film forming technique. Accordingly, in a device including such an intermediate region 140, leakage current from the gate electrode 130 can be suppressed so as to provide a good transistor characteristic.

In the formation of the FET of FIG. 1, for example, it is preferred that the drain electrode 120a and the source electrode 120b are formed on the p-type diamond layer 110, then a part of the p-type diamond layer 110 is made intrinsic by using these electrodes as a mask to form the intermediate region 140, and the gate electrode 130 is formed on the intrinsic intermediate region 140.

Process for Fabricating Semiconductor Device

FIGS. 2A to 2D show schematic sectional views showing an example of a process for fabricating the FET of FIG. 1.

Figure 2A:
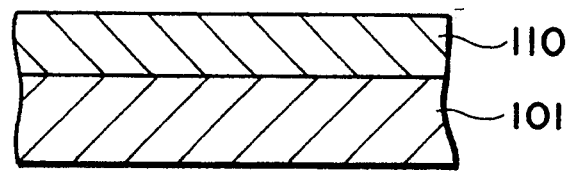
FIGS. 2A to 2D are schematic sectional views showing an embodiment of the process for fabricating the semiconductor device shown in FIG. 1.

Referring to FIGS. 2A to 2D, first, a p-type diamond layer 110 is grown on an insulating diamond substrate 101 (FIG. 2A).

In the present invention, the process for forming semiconductor diamond or non-doped diamond is not particularly restricted. For example, the diamond to be used in the present invention may comprise artificial (high-pressure synthesis) bulk single crystal, or a thin polycrystal film or thin single crystal film such as epitaxial film based on vapor deposition or vapor-phase synthesis. Advantageous effects of the present invention may be provided regardless which of the above kinds of diamond is used.

In a case where a diamond film is formed by vapor deposition, for example, various methods as described below may be used:

1) A method wherein electric discharge is conducted by use of a DC or AC electric field so as to activate a raw material gas or reactant gas;
2) A method wherein a thermoelectron emitting material or thermionic emission material is heated to activate a raw material gas;
3) A method wherein a surface on which diamond is to be grown is bombarded with ions;
4) A method wherein a raw material gas is excited by light such as laser beam and UV rays; and
5) A method wherein a raw material gas is burned.

All of these methods may be used in the present invention. Advantageous effects of the present invention may be provided regardless which of the above kinds of diamond-forming methods is used.

In the present invention, it is preferred to use a CVD (chemical vapor deposition) process in order to dope diamond with an n-type dopant or/and a p-type dopant, since the amount of the dopant to be added to the diamond may easily be regulated in the CVD process.

On the other hand, the insulating diamond substrate 101 to be used in the present invention may comprise natural or artificial (high-pressure synthesis) bulk single crystal, or polycrystal or single crystal which is formed by vapor deposition and is polished as desired.

Based on the step of FIG. 2A mentioned above, a flat p-type diamond layer 110 may be formed on the insulating diamond substrate 101.

Figure 2B:
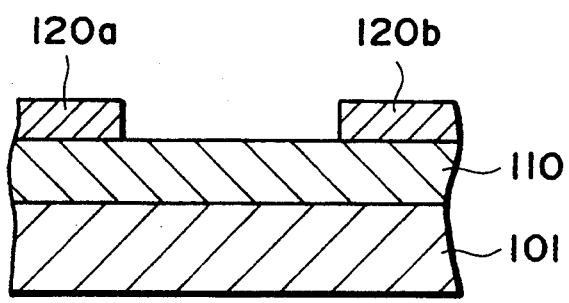

Then, a drain electrode 120a and a source electrode 120b are formed on the p-type diamond layer 110 (FIG. 2B). The material for these electrodes may comprise a metal having a melting point of 900° C. or higher as described above. It is preferred to use W and/or Ti as a material for these electrodes, since their functions as the electrodes can be maintained even when they are subjected to selective or partial film growth, surface treatment, etc., after the formation of these electrodes. In such a case, a self-aligned type device may easily be formed.

Figure 2C:
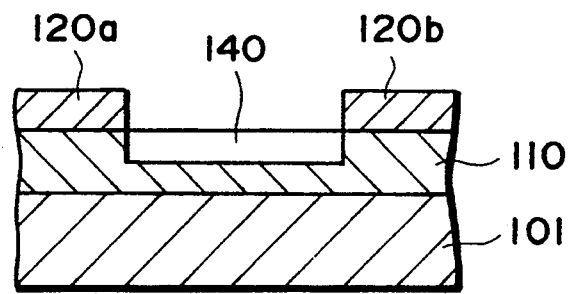

Then, an n-type dopant such as nitrogen atoms and phosphorus atoms, or a Group IV element such as carbon ions and silicon ions, is introduced into a part or a predetermined region of the p-type diamond layer 110, while the drain electrode 120a and the source electrode 120b are used as a mask, whereby that part of predetermined region of the p-type diamond layer 110 is made intrinsic so as to form an intermediate region 140 (FIG. 2C).

It is preferred that the intermediate region 140 is formed e.g., by introducing an n-type dopant to a part of the p-type diamond layer 110 by ion implantation, and then annealing the part by plasma annealing, thermal annealing, etc. When the n-type dopant is introduced in such a manner, the impurity (p-type dopant) in the p-type diamond layer 110 is compensated, and the predetermined part of the p-type diamond layer 110 is made intrinsic, whereby the intermediate region 140 is formed.

Alternatively, as described above, the intrinsic intermediate region 140 may also be formed in a predetermined region of the p-type diamond layer 110 by introducing a Group IV element such as carbon atoms and silicon atoms.

Figure 2D:
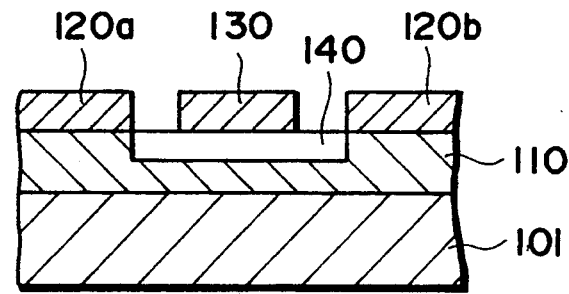

Then, a gate electrode 130 is formed on the intrinsic intermediate region 140 thus formed (FIG. 2D). The gate electrode 130 can be formed in the same manner as in the formation of a gate electrode in the usual semiconductor device fabrication process. More specifically, for example, the gate electrode 130 may be formed in the following manner.

That is, vapor deposition is conducted with respect to the entire surface of the intermediate product as shown in FIG. 2C, by using a material which is different from that for the drain electrode 120a and the source electrode 120b, and then the gate electrode 130 is formed by patterning by using an etchant having an etching time for the material of the gate electrode 130, which is different from that for the material of the drain electrode 120a and the source electrode 120b.

In the fabrication process shown in FIGS. 2A to 2D, since the intermediate region 140 is formed by converting a part of the p-type diamond layer 110 into an intrinsic part, the resultant intermediate region 140 can be provided uniformly. In comparison with the steps for forming a conventional insulating layer, e.g. a non-doped diamond layer, the fabrication process of FIGS. 2A to 2D has an advantage that a trap level is less liable to be provided at an interface between the p-type diamond layer 110 and the intermediate region 140. Accordingly, in such an embodiment, even when a high voltage is applied to the gate electrode 130, breakdown is less likely to occur. As a result, even when the gate electrode 130 is formed by using another material selected from various materials, such as Al and Au, a good operating characteristic may be obtained.

Hereinabove, the structure of the FET of FIG. 1, and an embodiment of the process for fabricating the FET have been described. Hereinbelow, the respective layers constituting the FET of FIG. 1 will be specifically described.

P-type Diamond Layer

In the FET of FIG. 1, the active layer 110 for providing a channel region comprises p-type diamond as a main component. The p-type diamond layer 110 may preferably have a thickness of 100 nm–1000 nm, in view of ohmic characteristic thereof with the drain electrode 120a and the source electrodes 120b.

The p-type dopant to be contained in the p-type diamond layer 110 may preferably comprise boron atoms. The concentration of the p-type dopant such as boron atoms may preferably be $10^{16}$–$10^{19}$ cm$^{-3}$, in view of the semiconductor characteristic.

The above concentration of p-type dopant may be measured, e.g., by secondary ion mass spectrometry (SIMS). In the SIMS measurement, for example, the following conditions (p-dopant analysis) may suitably be used.

|  | (n-dopant analysis) | (p-dopant analysis) |
|---|---|---|
| Primary ion | Cs$^+$ | O$_2{}^+$ |
| Acceleration voltage | 10 kV | 15 kV |
| Current | 580 nA | 2000 nA |
| Raster size | 250 μm square | 250 μm square |
| Analysis area (Intermediate Region) | diameter 62 μmΦ | μmΦ |

In the semiconductor device of FIG. 1, an intermediate region 140 comprising diamond doped with a p-type dopant and an n-type dopant (or a Group IV element) is formed between the above described p-type diamond layer 110 (channel region) and the gate electrode 130. In other words, the intermediate region 140 is formed in the area of a contact region between the p-type diamond layer 110 and the gate electrode 130.

The thickness of the intermediate region 140 may preferably be 500–20 nm in view of a transistor characteristic. Such a thickness of the intermediate region 140 can be determined by conducting SIMS analysis with respect to the depth direction thereof.

The n-type dopant to be contained in the intermediate region may preferably comprise nitrogen atoms. In view of a semiconductor characteristic, the concentration of the n-type dopant such as nitrogen atoms contained in the intermediate region may preferably be $10^{15}$ cm$^{-3}$ or more. The carrier concentration based on the n-type dopant in the intermediate region is markedly changed in the case of an n-type dopant concentration of not less than $10^{15}$ cm$^{-3}$ and less than $10^{19}$ cm$^{-3}$, as compared with that in the case of an n-type dopant concentration of not less than $10^{19}$ cm$^{-3}$. Accordingly it is preferred to select the n-type dopant concentration in accordance with a desired characteristic of the intermediate region, such as the resistivity insulating property, and n-type or p-type conductivity.

Such a concentration of the n-type dopant can also be measured, e.g. by SIMS. In this SIMS measurement, for example, measuring conditions (n-dopant analysis) similar to those as described above may suitably be employed.

In a case where the intermediate region is doped with boron atoms (p-type dopant) and nitrogen atoms (n-type dopant), the concentration of the nitrogen atom dopant (CN), and the concentration of the boron atom dopant (CB) may preferably have a relationship of $100CB \leqq CN > CB$, more preferably $10CB \leqq CN > CB$, in view of n-type conductivity of the intermediate region.

Other Embodiments

Figure 3:
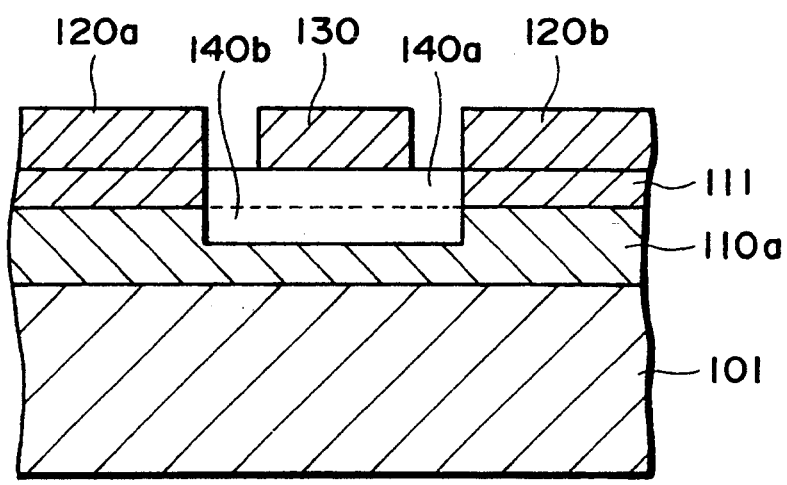
FIG. 3 is a schematic sectional view showing another embodiment of the semiconductor device according to the present invention.

FIG. 3 schematically shows a semiconductor device according to another embodiment of the present invention.

In this embodiment of FIG. 3, a p-type diamond layer comprises a high concentration-doped layer 111 containing a p-type dopant in a high concentration, and a low concentration-doped layer 110a containing a p-type dopant in a low concentration. The high concentration-doped layer 111 and the low concentration-doped layer 110a are disposed in this order from the side of a drain electrode 120a. Further, in place of the intermediate region 140 in FIG. 1, an insulating layer 140a, and a doped layer 140b containing a dopant and having a different p-dopant concentration from that in the insulating layer 140a are disposed in this order from the side of a gate electrode 130. The semiconductor of FIG. 3 has the same structure as that of FIG. 1 except that the above-mentioned layers corresponding to the p-type diamond layer 110 and the intermediate region 140 of the FIG. 1 have the different structures as described above.

In the embodiment of FIG. 3, since the high concentration-doped layer 111 containing the p-type dopant in a high concentration and having a low electric resistance is in contact with the drain electrode 120a and the source electrode 120b, its ohmic property with these electrodes is improved, i.e., a DC resistance component is decreased, whereby a further improved transistor characteristic may easily be obtained.

The low concentration-doped layer 110a may preferably have a p-type dopant concentration which is the same as that of the p-type diamond layer 110 in FIG. 1. The high concentration-doped layer 111 may preferably have a p-dopant concentration of about $10^{19}$–$10^{21}$ cm$^{-3}$.

The ratio (CPH/CPL) of the p-type dopant concentration (CPH) of the high concentration-doped layer 111 to the p-type dopant concentration (CPL) of the low concentration-doped layer 110a may preferably be about $10^1$–$10^6$.

FIGS. 4A to 4D show schematic sectional views of an embodiment of the process for fabricating the semiconductor device of FIG. 3.

In the fabrication process shown in FIGS. 4A to 4D, a low concentration-doped layer 110a doped with a p-type dopant is formed in the same manner as in FIGS. 2A to 2D. A high concentration-doped layer 111 is further formed on the low concentration-doped layer 110a. Then an intrinsic region 140a and a region 140b containing an n-type dopant are formed.

Figure 4A:
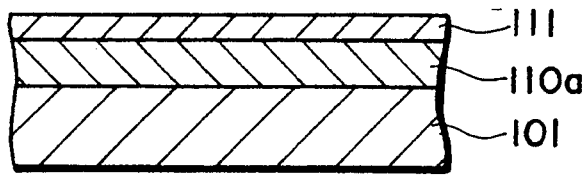
FIGS. 4A to 4D are schematic sectional views showing an embodiment of the process for fabricating the semiconductor device shown in FIG. 3.

Referring to FIGS. 4A to 4D, a diamond film doped with a p-type dopant is grown by vapor deposition on an insulating diamond substrate 101 to form a low concentration-doped layer 110a in the same manner as in FIGS. 2A to 2D. Then, while the flow rate or concentration of a gas containing the p-type dopant to be used for vapor deposition is changed, a diamond film doped with a p-type dopant in a higher concentration is grown by vapor deposition on the low concentration-doped layer 110a, thereby to form a high concentration-doped layer 111 preferably having a p-type dopant concentration of $10^{19}$–$10^{21}$ cm$^{-3}$ (FIG. 4A).

Figure 4B:
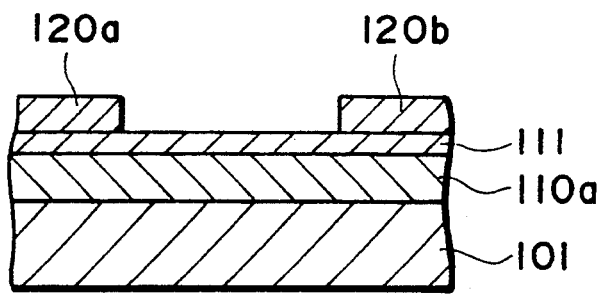

Then, in the same manner as in FIGS. 2A to 2D, a drain electrode 120a and a source electrode 120b are formed on the above high concentration-doped layer 111 (FIG. 4B). Thereafter, an n-type dopant or a Group IV element is introduced by ion implantation in a predetermined part of the doped layers 110a or/and 111 located between the drain electrode 120a and the source electrode 120b, thereby forming an insulating region 140a, and a doped layer 140b having a p-type dopant concentration different from that of the insulating region 140a (FIG. 4C).

Figure 4C:
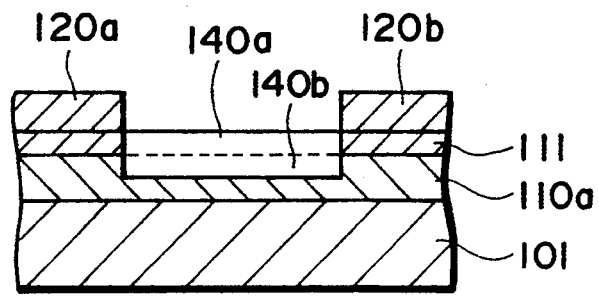

It is preferred to conduct annealing such as thermal annealing, and/or hydrogen plasma treatment after the step of FIG. 4C, in view of an improved transistor characteristic.

Figure 4D:
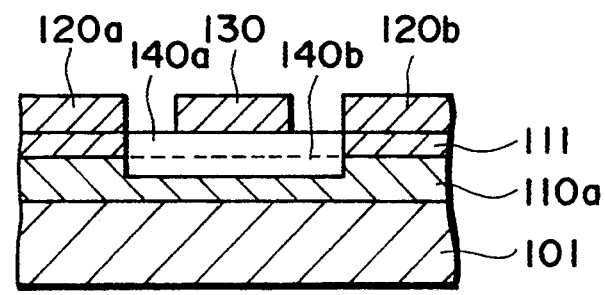

After the region 140a and the n-type dopant-containing region 140b are formed, a gate electrode 130 is formed by patterning on the insulating region 140a in the same manner as in FIGS: 2A to 2D (FIG. 4D).

In the thus fabricated FET of FIG. 3, since the high-concentration-doped layer 111 having a low electric resistance is provided and the series resistance of the FET is decreased as compared with the FET of FIG. 1, a better transistor characteristic may be obtained. In addition, in the process of FIGS. 4A to 4D, the high concentration-doped layer 111 having a p-dopant concentration different from that of the low concentration-doped layer 110a can be continuously or sequentially formed by changing the flow rate or/and the concentration of the p-type dopant-containing gas to be used for vapor deposition. When such a continuous formation process for the doped layers is adopted, the fabrication process may be simplified.

Figure 5:
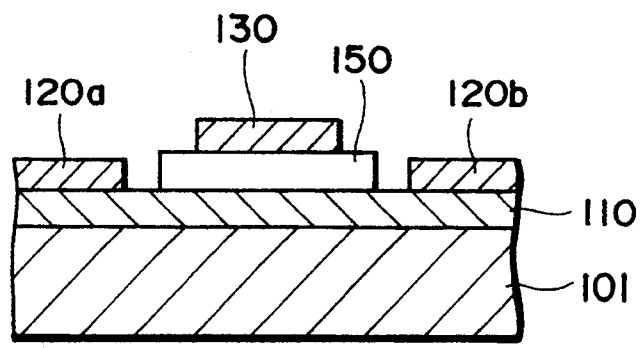
FIG. 5 is a schematic sectional view showing a further embodiment of the semiconductor device according to the present invention.

FIG. 5 schematically shows a further embodiment of the semiconductor device according to the present invention.

The semiconductor device of FIG. 5 has generally the same structure as that of FIG. 1 except that an intermediate region 150 to be formed under a gate electrode 130 is disposed on a p-type diamond layer 110. The above intermediate region 150 comprises diamond doped with an n-type dopant.

In view of a characteristic of semiconductor device, the concentration of the n-type dopant, such as nitrogen atoms, contained in the intermediate region 150 may preferably be $10^{15}$ cm$^{-3}$ or more. In a case where an intermediate region 150 having a high resistance is desired, the n-type dopant concentration therein may preferably be not less than $10^{15}$ cm$^{-3}$ and less than $10^{19}$ cm$^{-3}$. In a case where an intermediate region 150 having a low resistance is desired, the n-type dopant concentration therein may preferably be $10^{19}$ cm$^{-3}$ or more. The intermediate region 150 may preferably have a thickness of 500–20 nm.

Figure 6:
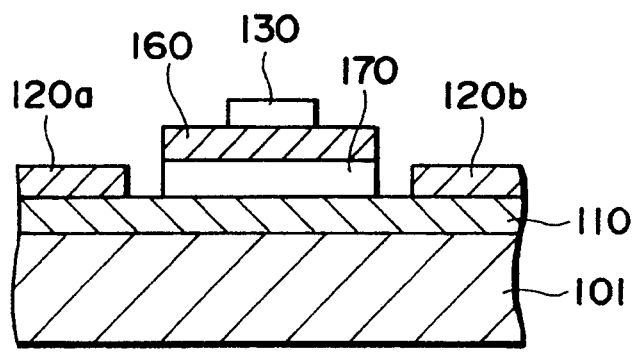
FIG. 6 is a schematic sectional view showing a further embodiment of the semiconductor device according to the present invention.

FIG. 6 schematically shows a further embodiment of the semiconductor device according to the present invention.

The semiconductor device of FIG. 6 has generally the same structure as that of FIG. 5, except that in place of the intermediate region 150 in FIG. 5, a non-doped diamond layer 160 is disposed under a gate electrode 130, and a diamond layer 170 doped with an n-type dopant is disposed immediately under the non-doped layer 160.

In view of a semiconductor characteristic, the concentration of the n-type dopant, such as nitrogen atoms, contained in the n-type diamond layer 170 may preferably be $10^{15}$ cm$^{-3}$ or more. In a case where an n-type layer 170 having a high resistance is desired, the n-type dopant concentration therein may preferably be not less than $10^{15}$ cm$^{-3}$ and less than $10^{19}$ cm$^{-3}$. In a case where an n-type layer 170 having a low resistance is desired, the n-type dopant concentration therein may preferably be $10^{19}$ cm$^{-3}$ or more. The non-doped layer 160 may preferably have a thickness of 1000–10 nm. The n-type layer 170 may preferably have a thickness of 500–10 nm.

Hereinbelow, the present invention will be described in further detail with reference to specific Examples.

EXAMPLE 1

Fabrication of FET of FIG. 1

In this Example, a diamond film doped with a p-type dopant was formed on an insulating substrate 101 thereby to provide a p-type layer 110, and a predetermined part of the p-type layer 110 was made intrinsic to form an intermediate region 140. First, a diamond film doped with boron atoms (p-type dopant) was grown by microwave CVD on the insulating diamond substrate 101 having a resistivity of not less than $10^{10}$ Ω.cm, thereby to form the p-type diamond layer 110 (FIG. 2A). Such vapor-phase growth was conducted in the following manner.

The insulating diamond substrate 101 was placed in a quartz reaction tube having a diameter of about 46 mm. As raw material gases or reactant gases, there were used hydrogen gas (flow rate: 100 SCCM), methane gas (flow rate: 4 SCCM), and diborane $B_2H_6$ diluted with hydrogen so as to provide a concentration of 10 ppm, flow rate: 100 SCCM). The pressure in the reaction tube was kept at 40 Torr, the power of the microwave for discharge was 400 W, and the temperature of the substrate 101 was 880° C. Under these conditions, p-type diamond layer 110 about 1 μthick was formed under discharge for two hours. In a case where this film was formed so as to provide a smaller thickness, an equivalent transistor characteristic could still be achieved by using a lower acceleration energy for ion implantation to be conducted in the latter step.

In this Example, a p-type diamond layer 110 having a boron atom concentration of 10 ppm and a film thickness of 600 nm was formed on the insulating diamond substrate 101.

When the above flow rate and concentration of the diborane diluted with hydrogen were changed, the resultant film growth rate and dopant content were changed, and the impurity concentration in the diamond film to be formed was changed. Even when the flow rate and concentration of hydrogen-diluted diborane were changed from 10 ppm of a diluted gas (flow rate: 1 SCCM) to 200 ppm of a diluted gas (flow rate: 10 SCCM) to change the impurity concentration of the p-type diamond layer 110, FETs having the same structure as that of the FET of FIG. 1 as described above were also obtained. When the flow rate of methane was low (6 SCCM or lower), good homo-junction epitaxial film was formed. When the flow rate of methane was changed, the resultant film growth rate and boron atom content were changed. It was found that the film characteristic was mainly determined by the boron atom concentration in the p-type diamond film.

FETs were fabricated in the following manner by using the thus prepared sample, and their characteristics were evaluated.

A drain electrode 120a and a source electrode 120b (material: Ti/Mo/Au, film thickness:20/20/100 nm, respectively) were formed by photolithography (FIG. 2B). At this time, a thin film of Au, Al, SiO$_2$, etc.,.was also formed on the drain electrode 120a and source electrode 120b by patterning in the same photolithographic process as mentioned above, so that the electrodes 120a and 120b would function as a mask in the ion implantation step to be conducted later.

Then, nitrogen atoms were introduced into a part of the p-type diamond layer 110 located between the drain electrode 120a and source electrode 120b by ion implantation at an acceleration voltage of 20–200 KeV (FIG. 2C). By this ion implantation, nitrogen atoms were added by doping to the above part of the p-type diamond layer 110 so as to provide a concentration of about $10^{19}$–$10^{21}$ cm$^{-3}$. The impurity of the p-type layer 110 in this part (boron atoms) was compensated, and the electric characteristic was considerably changed. As a result, a part of the layer 110 was made intrinsic so as to have an insulative property, whereby an intermediate region 140 was formed.

Then, a material for the gate electrode (Al) was vapor-deposited on the sample prepared above to provide a film thickness of 100 nm, and then subjected to patterning by photolithography to form a gate electrode 130 (FIG. 2D). As a result, a semiconductor device having a MISFET structure (gate length: 5 μm; gate width: 20 μm; source-gate distance: 2 μm; drain-gate distance: 2 μm) was fabricated.

Five kinds of FET samples (a–e) were fabricated while changing the acceleration energy for the above ion implantation and changing the dose amount (at/cm$^2$) of nitrogen atoms to be introduced into the p-type diamond layer 110. With respect to the thus prepared samples, mutual conductance ($g_m$), pinch-off voltage ($V_p$) and pinch-off current ($I_p$) were measured. The measurement results are shown in Table 1.

TABLE 1

|  | IMPLANTATION CONDITIONS | | CHARACTERISTICS | | |
|---|---|---|---|---|---|
|  | ACCELERATION ENERGY | DOSE (at/cm$^2$) | gm (μS/mm) | Vp (V) | Ip (μA) |
| SAMPLE |  |  |  |  |  |
| a | 40 KeV | 1 × 10$^{16}$ | 10 | 10 | 10 |
| b | 100 KeV | 1 × 10$^{16}$ | 50 | 3 | 15 |
| c | 200 KeV | 1 × 10$^{16}$ | 150 | 1 | 40 |
| d | 100 KeV | 1 × 10$^{15}$ | 60 | 3 | 20 |
| e | 100 KeV | 1 × 10$^{14}$ | 60 | 3 | 20 |
| COMPARATIVE SAMPLE |  |  | 1 | 20 | 1 |

Figure 7:
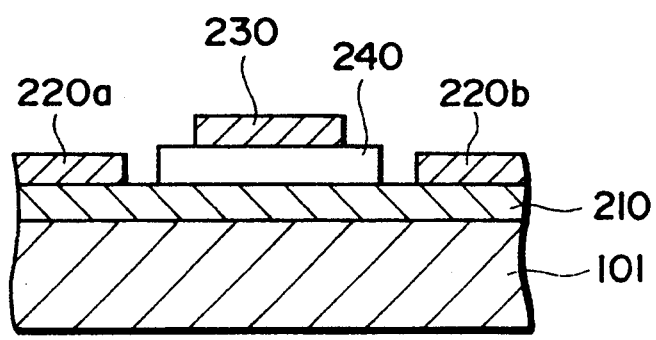
FIG. 7 is a schematic sectional view showing the structure of a comparative example prepared in Example 1.

The "comparative sample" in Table 1 was a sample having a structure, a section of which is shown in a schematic sectional view of FIG. 7. In this comparative sample, in place of the intermediate region 140 of the FET of FIG. 1, an intrinsic layer (non-doped diamond layer) 240 was disposed by selective growth technique. This FET was prepared by forming a p-type diamond layer 210 (boron atom concentration: $10^{17}$ cm$^{-3}$, film thickness: 100 nm) on an insulating diamond substrate 101, forming the intrinsic non-doped diamond layer 240 (film thickness: 200 nm) on the p-type layer 210 by selective growth technique, and then forming a drain electrode 220a, a source electrode 220b and a gate electrode 230 by photolithography.

As shown in Table 1, the FET according to the present invention having the structure of FIG. 1 had good characteristics, and could be operated at a voltage lower than that for the comparative sample having the structure of FIG. 7. In the FET according to the present invention, the boron atom concentration of the p-type diamond layer 110 was greatly concerned with the characteristic of the FETS obtained in this Example and Example 2 et seq., and was a predominant factor for determining the FET characteristic. Since the amount of boron atoms to be incorporated in the p-type layer 110 was changed by the pressure and microwave power at the time of the growth of the p-type layer 110, the characteristics of the FET could be changed by changing these values at the time of the growth.

EXAMPLE 2

Fabrication of FET of FIG. 3

In this Example 2, a p-type diamond layer 110a doped with boron was formed on an insulating diamond layer 101 in the same manner as in Example 1, a high-concentration boron-doped layer 111 was formed on the p-type diamond layer 110a, and then an intrinsic intermediate region 140 was formed by ion implantation (FIGS. 4A to 4D).

That is, a boron-doped diamond film (boron atom concentration: $10^{17}$ cm$^{-3}$, film thickness: 100 nm) was vapor-deposited on the layer 101 in the same manner as in Example 1. Then, a diamond film having a higher boron dopant concentration was vapor-deposited on the above p-type layer 110a, while the flow rate and concentration of hydrogen-diluted diborane were changed, to form a high concentration ($10^{19}$–$10^{21}$ cm$^{-3}$) boron-doped layer 111 (film thickness: 300 nm) (FIG. 4A).

Further, a drain electrode 120a and a source electrode 120b were formed in the same manner as in Example 1 (FIG. 4B), and then nitrogen atoms were introduced by ion implantation into a predetermined part of the p-type diamond layer 110a and the high concentration-doped layer 111 located between the drain electrode 120a and source electrode 120b (FIG. 4C). In this example, the conditions for the ion implantation were an acceleration energy of 200 KeV and a nitrogen atom dose of $10^{16}$ cm$^{-3}$. Then, a gate electrode 130 was formed by patterning in the same manner as in Example 1, thereby to fabricate an FET having a structure of FIG. 3 (FIG. 4D). The intermediate layer 140 was electrically insulating with a resistivity not less than $10^{10}$ $\Omega$.cm).

Since the thus fabricated FET of FIG. 3 had a high-concentration boron-doped layer 111 having a lower electric resistance, it had a smaller series resistance as compared with that of the FET of FIG. 1, and had better characteristics as compared with those of the FET of FIG. 1. In this example, by changing the flow rate and concentration of the hydrogen-diluted diborane, the p-type diamond layer 110a and the high-concentration boron-doped layer 111 having an impurity concentration different from that of the p-type diamond layer 110a were continuously formed, whereby the fabrication process could be simplified.

EXAMPLE 3

In this Example 3, before the formation of the gate electrode 130 in Example 2, thermal annealing treatment was conducted.

That is, in this Example 3, nitrogen atoms were introduced by ion implantation to form an intermediate region 140 in the process of FIGS. 4A to 4D in the same manner as in Example 2, and thereafter (i .e., after the step of FIG. 4C), the thermal annealing was conducted. Then, a gate electrode 130 was formed to fabricate an FET ( FIG. 4D ).

The following Table 2 shows characteristics of the FETs which were fabricated by preparing a sample to be thermally-annealed under the conditions for "Sample b" in Table 1, and lamp-annealing the sample for 60 minutes under the respective conditions. In this Example, further improved characteristics were provided due to the above annealing.

TABLE 2

| ANNEALING TEMP. | CHARACTERISTICS | | |
|---|---|---|---|
| | gm (μS/mm) | Vp (V) | Ip (μA) |
| 600° C. | 60 | 3 | 20 |
| 800° C. | 80 | 2 | 18 |
| 1000° C. | 80 | 2 | 18 |

EXAMPLE 4

In this Example 4, before the formation of the gate electrode 130 in Example 2, hydrogen plasma treatment was conducted.

That is, in this Example 4, nitrogen atoms were introduced by ion implantation to form an intermediate region 140 in the process of FIGS. 4A to 4D in the same manner as in Example 2, and thereafter, i.e., after the step of FIG. 4C, the hydrogen plasma treatment was conducted. Then, a gate electrode 130 was formed thereby to fabricate an FET ( FIG. 4D ).

The following Table 3 shows characteristics of the FETs which were fabricated by preparing a sample to be hydrogen plasma-treated under the conditions for "Sample b" in Table 1, and hydrogen plasma-treating the sample for 10 minutes under the respective conditions. In this Example, the thickness of the implantation layer, i.e. intermediate region 140, was decreased due to the above hydrogen plasma treatment, but the transistor characteristics were further improved.

TABLE 3

| HYDROGEN PLASMA CONDITIONS | | CHARACTERISTICS | | |
|---|---|---|---|---|
| MICROWAVE POWER (W) | TEMP. (°C.) | gm (μS/mm) | Vp (V) | Ip (μA) |
| 40 | 300 | 60 | 3 | 20 |
| 100 | 600 | 70 | 2 | 17 |
| 200 | 700 | 75 | 2 | 18 |

EXAMPLE 5

In this Example 5, NH$_3$ plasma irradiation was conducted in place of the nitrogen atom implantation employed in Example 1 to make a part of the p-diamond layer 110 intrinsic, thereby to forming an intermediate region 140.

That is, a boron-doped diamond layer was formed by vapor deposition on an insulating diamond substrate 101 to form a p-type diamond layer 110 (boron atom concentration: $10^{17}$ cm$^{-3}$; film thickness: 100 nm) in the same manner as in Example 1 (FIG. 2A), and then a drain electrode 120a and a source electrode 120b were formed, thereby to prepare a Sample shown in FIG. 2B.

Next, NH$_3$ gas was decomposed by plasma and the plasma was irradiated for 120 minutes at a relatively high temperature for plasma treatment so that nitrogen atoms were introduced into a part of the p-type diamond layer 110 located between the drain electrode 120a and the source electrode 120b, thereby forming the intrinsic intermediate region 140 (FIG. 2C). Then, a gate electrode 130 was formed in the same manner as in Example 1 (FIG. 2D), thereby fabricating an FET. The above intermediate region 140 was electrically insulating.

The following Table 4 shows characteristics of the FETs which were fabricated by plasma-treating a sample (FIG. 2B), which had been prepared in the same manner as in Example 1 so as to provide the same parameters, such as film thickness, while the power of microwaves for the generation of NH$_3$ plasma and the temperature in the plasma treatment were changed. In this example, characteristics equivalent to those obtained in the above Examples were obtained.

TABLE 4

| AMMONIA PLASMA CONDITIONS | | CHARACTERISTICS | | |
|---|---|---|---|---|
| MICROWAVE POWER (W) | TEMP. (°C.) | gm ($\mu$S/mm) | Vp (V) | Ip ($\mu$A) |
| 200 | 650 | 40 | 5 | 15 |
| 300 | 800 | 50 | 5 | 10 |
| 500 | 950 | 60 | 4 | 12 |

EXAMPLE 6

In this Example 6, intrinsic intermediate regions 140 were formed, while various different elements were used as the element to be ion-implanted was in place of nitrogen used in Example 1.

That is, a boron-doped diamond layer was formed by vapor deposition on an insulating diamond substrate 101 to form a p-type diamond layer 110 (boron atom concentration: $10^{17}$ cm$^{-3}$; film thickness: 100 nm) in the same manner as in Example 1 (FIG. 2A), and then a drain electrode 120a and a source electrode 120b were formed, thereby preparing a sample shown in FIG. 2B.

Then, each of carbon, silicon and phosphorus was respectively introduced by ion implantation into a part of the layer 110 located between the drain electrode 120a and the source electrode 120b at an acceleration voltage of 20-200 KeV (FIG. 2C).

Due to the ion implantation, the p-type diamond layer 110 was partially made intrinsic, and the electric characteristic thereof was greatly changed, for example when phosphorus was ion-implanted, an impurity (boron) of the layer 110 is compensated. As a result, the part subjected to the ion implantation was made insulating thereby forming the intermediate region 140. Then, a gate electrode 130 was formed in the same manner as in Example 1 (FIG. 2D), thereby fabricating an FET.

The following Table 5 shows characteristics of the FETs which were fabricated by implanting ions into a sample (FIG. 2B), which had been prepared in the same manner as in Example 1 so as to provide the same parameters, such as film thickness, while the kind of element to be ion-implanted and the acceleration voltage were changed in various manners. In this example, characteristics equivalent to those obtained in Example 1 were obtained.

TABLE 5

| IMPLANTED ION | IMPLANTATION CONDITIONS | | CHARACTERISTICS | | |
|---|---|---|---|---|---|
| | ENERGY | DOSE (at/cm$^2$) | gm ($\mu$S/mm) | Vp (V) | Ip ($\mu$A) |
| CARBON | 20 KeV | $10^{16}$ | 10 | 15 | 20 |
| | 100 KeV | $10^{15}$ | 5 | 10 | 5 |
| | 80 KeV | $10^{16}$ | 15 | 8 | 10 |
| SILICON | 20 KeV | $10^{16}$ | 10 | 20 | 20 |
| | 60 KeV | $10^{15}$ | 10 | 15 | 15 |
| | 100 KeV | $10^{16}$ | 5 | 10 | 5 |
| PHOSPHORUS | 20 KeV | $10^{16}$ | 10 | 25 | 20 |
| | 60 KeV | $10^{15}$ | 10 | 18 | 15 |
| | 100 KeV | $10^{16}$ | 5 | 10 | 5 |

EXAMPLE 7

The sample (FIG. 2B) prepared in Example 6 was heat-treated for 60 minutes at 600° C. and 800° C., respectively. In such a case, substantially no deterioration of characteristics was observed in the resultant FET, and good operating characteristics could be obtained. That is, it was found that in the fabrication process of Example 6, the gate electrode 130 could also be formed after the heat-treatment as desired.

EXAMPLE 8

Figure 8:
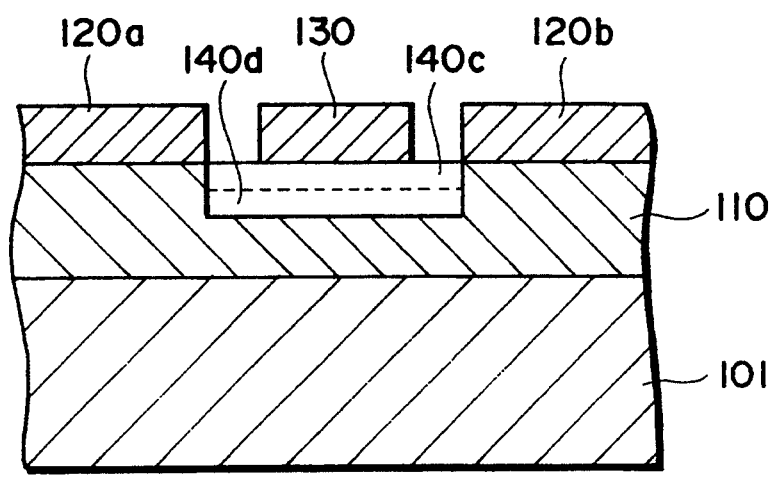
FIG. 8 a schematic sectional view showing the structure of a semiconductor device according to the present invention prepared in Example 1.

Each of the FET samples prepared in Example 1 were further investigated by a four-probe method with respect to the structure thereof. Most of the samples had the structure of FIG. 1 (expected structure), but it was found that some of the samples (e.g., Sample c) actually had a structure as shown in FIG. 8. That is, with respect to these samples, the intermediate region 140 in FIG. 1 comprised a higher-resistance layer (insulating layer) 140c and a lower resistance n-layer 140d.

Then, an FET sample, a schematic section of which is shown in FIG. 6, was fabricated by forming an n-type diamond layer 170, and a non-doped diamond layer 160 on the p-type diamond layer 110 by a selective growth technique, in place of the intermediate region 140 of the FET in FIG. 1.

More specifically, the FET of FIG. 6 was fabricated by forming a p-type diamond layer 110 (boron atom concentration: $10^{17}$ cm$^{-3}$, film thickness: 100 nm) on an insulating diamond substrate 101, selectively growing a lower-resistance n-type diamond layer 170 (nitrogen atom concentration: $10^{19}$ cm$^{-3}$; film thickness: 100 nm) and a non-doped diamond layer 160 (film thickness: 200 nm) on the p-type layer 110, respectively, and then forming a drain electrode 120a, a source electrode 120b and a gate electrode 130 by photolithography.

It was found that the thus fabricated FET of FIG. 6 had FET characteristics which were not as good as those of the FET of Example 1 (FIG. 1 ), but were better than those of the "Comparative Sample" FET of FIG. 7.

EXAMPLE 9

FET characteristics of the sample (FIG. 3) prepared in Example 4 were investigated while the temperature was changed.

As a result, it was found that the FET of Example 4 had much better FET characteristics than those of the "Comparative Sample" FET of FIG. 7, particularly at a high temperature (500° C.). Further, when the resistivity of the surface intermediate region (i.e., the layer 140a in FIG. 3), which had been considered as an insulating region at room temperature, was measured, it was found that the surface had a low resistance at a high temperature (500° C.).

Figure 9:
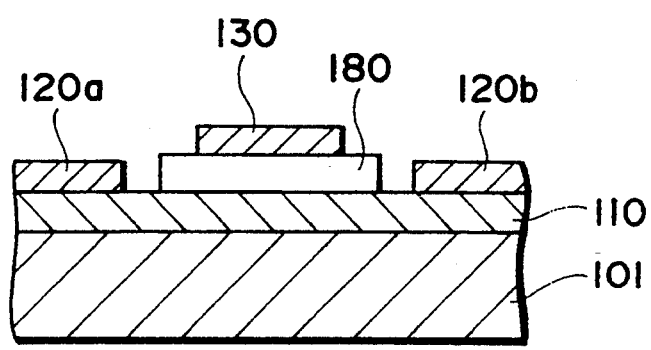
FIG. 9 is a schematic sectional view showing the structure of a semiconductor device according to the present invention prepared in Example 9.

Then, an FET sample, a schematic section of which is shown in FIG. 9, was fabricated by forming a diamond layer (nitrogen-doped layer) 180 containing an n-type dopant on a p-type diamond layer 110 by a selective growth technique.

The nitrogen atom concentration of the above nitrogen-doped layer 180 was not less than $10^{15}$ cm$^{-3}$ and less than $10^{19}$ cm$^{-3}$.

The FET of FIG. 9 was fabricated by forming a p-type diamond layer 110 (boron atom concentration: $10^{17}$ cm$^{-3}$, film thickness: 100 nm) on an insulating diamond substrate 101, selectively growing an n-type diamond layer 180 (nitrogen atom concentration: not less than $10^{15}$ cm$^{-3}$ and less than $10^{19}$ cm$^{-3}$), and then forming a drain electrode 120a, a source electrode 120b and a gate electrode 130 by photolithography.

FET characteristics of the FET of FIG. 9 were compared with those of the "Comparative Sample" FET of FIG. 7, wherein the intermediate layer 240 consisted of a non-doped diamond layer. The comparison results are shown in the following Table 6.

TABLE 6

| NITROGEN CONTENT (cm$^{-3}$) | | gm (μS/mm) | gm AT HIGH TEMP. |
|---|---|---|---|
| | NITROGEN-DOPED LAYER THICKNESS (Å) | | |
| $1 \times 10^{15}$ | 2000 | 30 | 100 |
| $1 \times 10^{16}$ | 2000 | 30 | 120 |
| $1 \times 10^{17}$ | 2000 | 30 | 150 |
| $1 \times 10^{18}$ | 2000 | 30 | 150 |
| $1 \times 10^{18}$ | 1000 | 30 | 150 |
| $1 \times 10^{18}$ | 500 | 30 | 150 |
| | NON-DOPED LAYER THICKNESS (Å) | | |
| | 7000 | 3 | <10 |
| | 2000 | 3 | <5 |
| | 1000 | <1 | <1 |

The nitrogen-doped layer 180 was insulating at room temperature, but had a low resistance at a high temperature (500° C.) as shown in Table 6.

EXAMPLE 10

Figure 10:
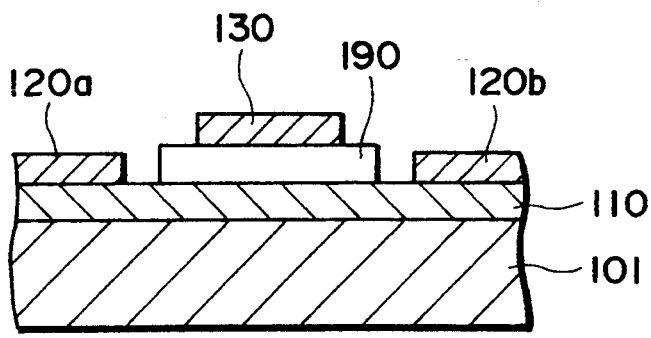
FIG. 10 is a schematic sectional view showing the structure of a semiconductor device according to the present invention prepared in Example 10.

An FET, a schematic section of which is shown in FIG. 10, was fabricated in the same manner as in Example 9 except that an n-type diamond layer 190 (nitrogen atom concentration: $10^{19}$ cm$^{-3}$) was formed in place of the n-type diamond layer 180 (nitrogen atom concentration: not less than $10^{15}$ cm$^{-3}$ and less than $10^{19}$ cm$^{-3}$) shown in FIG. 9.

The FET of FIG. 10 had characteristics ($g_m = 10$–$30$ μS/mm) which were not as good as those of the FET of Example 9 (FIG. 9), but were better than those of the "Comparative Sample" FET of FIG. 7, wherein the intermediate region 240 consisted of a non-doped diamond layer.

As described hereinabove, according to the present invention, there is provided a semiconductor device which not only has characteristics of high carrier mobility, small dielectric constant and high breakdown voltage based on characteristics of semiconductor diamond, but also has only a small leakage current from the gate electrode thereof and a good transistor characteristic due to the provision of an intermediate region, e.g., a diamond layer containing a p-type or n-type dopant, between the channel region and the gate electrode.

The semiconductor device according to the present invention having the above structure can also provide good characteristics of improved voltage durability and environmental durability including resistance to temperature, output, etc, and good frequency characteristic.

In addition, in the present invention, it is easy to form the above intermediate region in a self-aligned manner. Accordingly, the intermediate region may be formed accurately corresponding to the positions of a drain electrode and a source electrode. In such an embodiment, a semiconductor device having further improved characteristics may easily be fabricated.

From the invention thus described, it should be understood that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising: a source electrode and a drain electrode disposed on a substrate; a channel region located between the source and drain electrodes, which comprises p-type diamond as a main component; a gate electrode disposed on the channel region; and an intermediate region formed between the channel region and the gate electrode, which comprises diamond doped with at least an n-type dopant.

2. A semiconductor device according to claim 1, wherein the p-type dopant contained in the p-type diamond comprises boron atoms.

3. A semiconductor device according to claim 1, wherein the n-type dopant comprises nitrogen atoms.

4. A semiconductor device according to claim 3, wherein the intermediate region comprises diamond doped with nitrogen atoms in a concentration of not less than $10^5$ cm$^{-3}$ and less than $10^{19}$ cm$^{-3}$.

5. A semiconductor device according to claim 3, wherein the intermediate region comprises diamond doped with nitrogen atoms in a concentration of $10^{19}$ cm$^{-3}$ or more.

6. A semiconductor device according to claim 3, wherein the intermediate region comprises diamond doped with nitrogen atoms and boron atoms respectively in a nitrogen atom concentration (CN) and a boron atom concentration (CB) satisfying a relationship of 100CB≦CN>CB.

7. A semiconductor device according to claim 6, wherein the nitrogen atom concentration (CN) and the boron atom concentration (CB) satisfy a relationship of 10CB≦CN>CB.

8. A semiconductor device according to claim 1, wherein the intermediate region is formed by introducing an n-type dopant into p-type diamond by ion implantation.

9. A semiconductor device, comprising: a source electrode and a drain electrode disposed on a substrate; a channel region located between the source and drain electrodes, which comprises p-type diamond as a main component; a gate electrode disposed on the channel region; and an insulating layer and a layer containing an n-type dopant which are formed between the channel region and the gate electrode in this order from the gate electrode side.

10. A semiconductor device according to claim 9, wherein the n-type dopant-containing layer comprises diamond doped with nitrogen atoms as the n-type dopant in a nitrogen atom concentration of not less than $10^{15}$ cm$^{-3}$ and less than $10^{19}$ cm$^{-3}$.

11. A semiconductor device according to claim 9, wherein the n-type dopant-containing layer comprises diamond doped with nitrogen atoms as the n-type dopant in a nitrogen atom concentration of $10^{19}$ cm$^{-3}$ or more.

12. A semiconductor device according to claim 9, wherein the n-type dopant-containing layer comprises diamond doped with nitrogen atoms as the n-type dopant and boron atoms, respectively in a nitrogen atom concentration (CN) and a boron atom concentration (CB) satisfying a relationship of 100CB≦CN>CB.

13. A semiconductor device according to claim 12, wherein the nitrogen atom concentration (CN) and the boron atom concentration (CB) satisfy a relationship of 10CB≦CN>CB.

14. A semiconductor device according to claim 9, wherein the insulating layer and the n-type dopant-containing layer are formed by introducing an n-type dopant into p-type diamond by ion implantation.

15. A semiconductor device according to claim 9, wherein the insulating layer and the n-type dopant-containing layer contain a p-type dopant and contain an n-type dopant introduced thereinto by ion implantation.

16. A semiconductor device, comprising: a source electrode and a drain electrode disposed on a substrate; a channel region located between the source and drain electrodes, which comprises p-type diamond as a main component; a gate electrode disposed on the channel region; and an insulating region which is formed between the channel region and the gate electrode, and is formed by ion implantation into p-type diamond.

17. A semiconductor device according to claim 16, wherein the insulating region comprises diamond doped with nitrogen atoms as an n-type dopant in a nitrogen atom concentration of not less than $10^{15}$ cm$^{-3}$ and less than $10^{19}$ Cm$^{-3}$.

18. A semiconductor device according to claim 16, wherein the insulating region comprises diamond doped with nitrogen atoms as an n-type dopant in a nitrogen atom concentration of $10^{19}$ cm$^{-3}$ or more.

19. A semiconductor device according to claim 16, wherein the insulating region is formed by introducing an n-type dopant or a Group IV element into the p-type diamond by ion implantation.

20. A semiconductor device, comprising: a source electrode and a drain electrode disposed on a substrate; a channel region located between the source and drain electrodes, which comprises p-type diamond as a main component; a gate electrode disposed on the channel region; and an intermediate region formed between the channel region and the gate electrode, which comprises diamond doped with at least an n-type or p-type dopant in a predetermined amount.

21. A semiconductor device, comprising: a source electrode and a drain electrode disposed on a substrate; a channel region located between the source and drain electrodes, which comprises p-type diamond as a main component; a gate electrode disposed on the channel region; and an intermediate region formed between the channel region and the gate electrode, which comprises diamond doped with at least an n-type or p-type dopant.

* * * * *

UNITED STATES PATENT AND TRADEMARK OFFICE
CERTIFICATE OF CORRECTION

PATENT NO. : 5,382,809
DATED : January 17, 1995
INVENTOR(S) : Nishibayashi et al.

It is certified that error appears in the above-indentified patent and that said Letters Patent is hereby corrected as shown below:

Column 1, line 10, delete "that".
Column 5, line 57, replace "advantages" by --advantageous--.
Column 6, line 33, after "as" insert --an--.
Column 7, line 17, replace "of" by --or--.
Column 8, line 30, replace "$\mu m\Phi$" (second occurrence) by
 -- $62 \mu m\Phi$ --.
Column 9, line 4, replace "$\leq$" (both instances) by --$\geq$--.

Column 14, line 41, delete "thereby";
 line 67, delete "to".

UNITED STATES PATENT AND TRADEMARK OFFICE
CERTIFICATE OF CORRECTION

PATENT NO. : 5,382,809
DATED : January 17, 1995
INVENTOR(S) : Nishibayashi et al It is certified that error appears in the above-indentified patent and that said Letters Patent is hereby corrected as shown below:

Column 15, line 42, delete "was".
Column 16, line 37, replace "c)" by --$\underline{c}$)--.

Column 18, line 57, claim 6, , replace "$\leq$" by --$\geq$--.
Column 18, line 61, claim 7, , replace "$\leq$" by --$\geq$--.
Column 19, line 32, claim 12, , replace "$\leq$" by --$\geq$--.
Column 19, line 26, claim 13, , replace "$\leq$" by --$\geq$--.
Column 20, line 10, claim 17, , replace "Cm" by --cm--.

Signed and Sealed this

Twenty-fifth Day of April, 1995

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO. : 5,382,809
DATED : January 17, 1995
INVENTOR(S) : Nishibayashi et al It is certified that error appears in the above-indentified patent and that said Letters Patent is hereby corrected as shown below:

```
Column  1, line 10, delete "that".
Column  5, line 57, replace "advantages" by --advantageous--.
Column  6, line 33, after "as" insert --an--.
Column  7, line 17, replace "of" by --or--.
Column  8, line 30, replace "µmɷ" (second occurrence) by
                    -- 62 µmɷ--.
Column  9, line  4, replace "≤" (both instances) by --≥--.
Column 11, line 33 before "flow" insert --(--;
           line 37, replace "1 µthick" by --1 µm thick--.
Column 14, line 41, delete "thereby";
           line 67, delete "to".
Column 15, line 42, delete "was".
Column 16, line 37, replace "c)" by --c)--.
```

UNITED STATES PATENT AND TRADEMARK OFFICE
CERTIFICATE OF CORRECTION

PATENT NO. : 5,382,809
DATED : January 17, 1995
INVENTOR(S) : Nishibayashi et al It is certified that error appears in the above-indentified patent and that said Letters Patent is hereby corrected as shown below:

Column 18, claim 6, claim line 6, replace "$\leq$" by --$\geq$--.
Column 18, claim 7, claim line 4, replace "$\leq$" by --$\geq$--.
Column 19, claim 12, claim line 6, replace "$\leq$" by --$\geq$--.
Column 19, claim 13, claim line 4, replace "$\leq$" by --$\geq$--.
Column 20, Claim 17, claim line 5, replace "Cm" by --cm--.

This certificate supersedes Certificate of Correction issued April 25, 1995.

Signed and Sealed this

Twelfth Day of September, 1995

Attest:

BRUCE LEHMAN

*Attesting Officer*  *Commissioner of Patents and Trademarks*